(12) United States Patent
Cortes

(10) Patent No.: US 11,844,189 B2
(45) Date of Patent: Dec. 12, 2023

(54) DEVICE IDENTIFICATION SYSTEM AND PROCESS IN A DATACENTER

(71) Applicant: BULL SAS, Les Clayes-sous-Bois (FR)

(72) Inventor: Sébastien Cortes, Echirolles (FR)

( * ) Notice: Subject to any disclaimer, the term of this patent is extended or adjusted under 35 U.S.C. 154(b) by 0 days.

(21) Appl. No.: 17/408,338

(22) Filed: Aug. 20, 2021

(65) Prior Publication Data
US 2022/0061182 A1 Feb. 24, 2022

(30) Foreign Application Priority Data

Aug. 24, 2020 (EP) .................................... 20305948

(51) Int. Cl.
*H05K 7/14* (2006.01)
*G06K 19/07* (2006.01)

(52) U.S. Cl.
CPC ....... *H05K 7/1498* (2013.01); *G06K 19/0723* (2013.01); *H05K 7/1492* (2013.01)

(58) Field of Classification Search
CPC ......... G06K 19/0723; G06Q 10/06395; G06Q 10/0875; G06Q 10/20; H05K 7/1492; H05K 7/1494; H05K 7/1498
See application file for complete search history.

(56) References Cited

U.S. PATENT DOCUMENTS

| 8,138,925 | B2 | 3/2012 | Downie et al. |
| 8,798,078 | B2 | 8/2014 | Moore et al. |
| 9,996,119 | B2 | 6/2018 | Leigh et al. |
| 2005/0286220 | A1* | 12/2005 | Moore ............... H05K 7/20836 361/679.46 |
| 2012/0133510 | A1 | 5/2012 | Pierce et al. |
| 2012/0166693 | A1 | 6/2012 | Weinstock et al. |
| 2014/0253289 | A1* | 9/2014 | Groth .................... H05K 7/1498 340/8.1 |
| 2016/0128238 | A1* | 5/2016 | Shedd ..................... F25B 41/42 361/679.47 |

FOREIGN PATENT DOCUMENTS

| WO | 2010094460 A1 | 8/2010 |
| WO | 2010104519 A1 | 9/2010 |
| WO | 2017120502 A1 | 7/2017 |

OTHER PUBLICATIONS

European Search Report issued in EP20305948, dated Oct. 26, 2020 (3 pages).

* cited by examiner

*Primary Examiner* — Omer S Khan
(74) *Attorney, Agent, or Firm* — ARC IP LAW, PC; Joseph J. Mayo

(57) ABSTRACT

A group of at least one cluster and at least one device in a datacenter, wherein the cluster comprises vertically stacked housings, each configured to house one device, the cluster comprising one bus connected to one controlling module, and comprising one data and power line and one ground line both extending vertically continuously along the cluster. The device comprises one electronic tag configured to store an identifier of said device and fixed on the surface of the device in a way to automatically connect the bus when the device is housed in any housing of the cluster. The controlling module is configured to read the identifier when the electronic tag is connected to the bus, to identify the device housed in the cluster.

8 Claims, 6 Drawing Sheets und for each device dismounting, which is time-consuming.

In a similar way, it is known by the patent application US2014/0253289A1 a rack equipment with an electronic tag storing an identifier and comprising a connector to plug on a connection point of a bus extending along the cluster. Such a solution presents the same drawbacks.

The patent application U.S. Pat. No. 9,996,119B2 discloses to mount, at the height of each rack housing, a movable arm comprising a connector to manually connect a connector of a device equipment.

Incidentally, it is known by the patent application WO2017/120502A1 to execute a routine via a bus to read the data of a sensor mounted on a rack equipment. In the field of rack cooling, it is also known by the patent application US2005286220A1 to dispose sensors along the rack that are interconnected by a bus and sense temperature, pressure or the like.

An objective of one or more embodiments of the invention is therefore to identify the devices housed in a cluster of a datacenter while eliminating at least some of the above-mentioned drawbacks.

DEVICE IDENTIFICATION SYSTEM AND PROCESS IN A DATACENTER

This application claims priority to foreign utility patent application EP20305948, filed 24 Aug. 2020, the specification of which is hereby incorporated herein by reference.

BACKGROUND OF THE INVENTION

Field of the Invention

The field of the invention relates to device identification in a datacenter.

Description of the Related Art

As illustrated in FIG. 1, a datacenter comprises several devices 200, such as servers, switches and routers, to organize, process and store data. A datacenter also comprises several racks, called "clusters 100", arranged in rows within the datacenter and configured to house said devices 200, to optimize footprint and for ease of wiring. In practice, a datacenter usually comprises more than one hundred clusters 100 each housing up to twenty devices 200.

As represented on FIG. 1, a cluster 100 comprises two vertical side walls 110 delimiting a central cavity C with a front opening O, so as to define vertically stacked housings 111. Each housing 111 is configured to house a device 200 and comprises guiding members 112, mounted onto the two vertical side walls 110, and an abutment portion 113 at the front end of the two vertical side walls 110.

As represented on FIG. 1, each device 200 comprises a main body 210 and rails 211 laterally mounted onto the main body 210 to cooperate with the guiding members 112 of a housing 111 to slide the main body 210 into said housing 111. Each device 200 also comprises lateral grip members 212 configured to abut the abutment portion 113 when said device 200 is housed in said housing 111. The lateral grip members 212 usually comprise fixation means 213 to the abutment portion 113 to ensure proper mechanical mounting of the device 200. Besides its mechanical mounting, each device 200 is connected to a power distribution unit, known as PDU, and to a network thanks to a management node (not represented) located within the cluster 100.

In practice, due to the large number of devices 200 in a datacenter, it is requested to provide an overview of the devices 200 housed in each cluster 100, so as to ensure operability and maintenance. Moreover, this overview needs to be updated, since devices 200 are likely to be moved from one cluster 100 to another in the datacenter or to be replaced for maintenance, most of the time by different operators. Traditionally, such an updated overview is provided by manually identifying the devices 200 in a datacenter management system, which is both time-consuming and error-prone.

To reduce these drawbacks, it is known by the patent application US2012166693A1 to install a strip vertically along each cluster 100, which is wired to the datacenter management system and comprises a strip connector at the vertical position of each housing 111. Each device 200 is equipped with a tag storing the identifier of said device 200 and comprising a tag connector. When said device 200 is housed in a housing 111, its connector tag is manually connected to the strip connector of said housing 11 to transmit the device identifier to the datacenter management system. This process still requires a manual action, which is error-prone. Moreover, this action needs to be repeated for each device mounting and undone for each device dismounting, which is time-consuming.

BRIEF SUMMARY OF THE INVENTION

The invention relates to a group of at least one cluster and at least one device in a datacenter, wherein:
  the cluster comprises a plurality of vertically stacked housings, each housing being configured to house one device, the cluster comprising at least one controlling module and at least one bus connected to the controlling module, the bus comprising one data and power line and one ground line both extending vertically continuously along the cluster,
  the device comprises at least one electronic tag configured to store an identifier of said device and forming together with the controlling module and the bus a device identification system, the electronic tag being fixed on the external surface of the device in a way to come in physical contact with both the data and power line and the ground line, when the device is housed in any housing of the cluster, so as to automatically connect the bus, and
  the controlling module is configured to read the identifier, when the electronic tag is connected to the bus, so as to identify the device housed in the cluster.

The device identification system of the invention advantageously allows to automatically identify a device housed in a cluster while its mounting in a housing of the cluster. The connection between the electronic tag of a device and the bus of the cluster is indeed achieved by simple physical contact while housing the device. No specific manual action, for instance plugging the electronic tag on the bus, is required as in the prior art, which is time-efficient and safer. Moreover, the device identification system has a compact design which reduces footprint. The bus indeed extends vertically along the cluster to connect the electronic tag of each device and only comprises two lines: a power and data line and a ground line.

In one or more embodiments, the group comprises several devices, in particular of different types and natures, configured to be housed in the cluster and to be identified.

In one or more embodiments, the device comprises a single electronic tag to optimize footprint.

According to one aspect of the invention, the cluster comprises a single bus to optimize footprint. In other words, the bus is connected in series with the electronic tag of each device housed in the cluster.

According to one aspect of the invention, the bus is only constituted of one data and power line and one ground line. In other words, the bus is free from plug connectors guiding the electronic tag of the device against the two lines. The connection is obtained by simple contact without any intermediate.

According to one aspect of the invention, the data and power line is in the form of a bare wire to connect the electronic tag by physical contact. In one or more embodiments, the ground line is in the form of a bare wire to connect the electronic tag by physical contact. In other words, the data and power line and the ground line are free from insulating tubing. This allows a simple connection to the electronic tag of a device at any height of the bus.

In one or more embodiments, the data and power line and the ground line extend separately next to each other, to limit the size of the electronic tag.

According to one aspect of the invention, the data and power line and the ground line extend in an elementary motif identically repeated for each housing. In other words, the data and power line and the ground line extend identically in each housing so that the electronic tag fixed on the device can automatically connect the bus in any housing of the cluster.

In one or more embodiments, the data and power line and the ground line extend in parallel straight lines vertically along the cluster to facilitate their installation and their connection with the electronic tag of the device.

According to a first aspect:
the cluster comprises two vertical side walls delimiting a central cavity with a front opening so as to define the housings, each housing comprising guiding members mounted onto the two vertical side walls and an abutment portion at the front end of the two vertical side walls, the bus being mounted onto the abutment portion of each housing, and
the device comprises a main body and rails laterally mounted onto the main body to cooperate with the guiding members of a housing to slide the main body into said housing, the device comprising lateral grip members configured to abut the abutment portion when the device is housed in said housing, the electronic tag being fixed on at least one of the lateral grip members.

According to an aspect, the electronic tag is fixed on the back face of said lateral grip member.

The electronic tag of the device thus advantageously comes in physical contact with the bus when the lateral grip members of the device abut the abutment portion of the cluster, when mounting in a housing.

According to a second aspect:
the cluster comprises two vertical side walls delimiting a central cavity with a front opening so as to define the housings, each housing comprising guiding members mounted onto the two vertical side walls, the bus being mounted onto at least one of the two vertical side walls crossing the guiding members of each housing,
the device comprises a main body and rails laterally mounted onto the main body to cooperate with the guiding members of a housing to slide the main body into said housing, the electronic tag being laterally fixed on the main body.

The electronic tag of the device thus advantageously comes in physical contact with the bus when the rails of the device cooperate with the guiding members of a housing of the cluster, to mount the device.

In one or more embodiments, the electronic tag comprises a thickness of less than 1 mm to reduce footprint and facilitate the device installation in a housing.

In one or more embodiments, the electronic tag is configured to store the vertical position of a given housing where the device is housed. In one or more embodiments, the controlling module is configured to read the position of the device in the cluster, when the electronic tag is connected to the bus, so as to locate the device housed in the cluster. The device identification system thus allows to both identify and locate the devices housed in a cluster by automatically reading an electronic tag fixed on each device.

According to one aspect of the invention, the group comprises a datacenter management system connected to the controlling module and configured to provide, from the identifier of the device housed in the cluster, an updated overview of the devices in the datacenter. It is advantageously possible to know the exact composition of a datacenter at a given moment immediately and automatically.

In one or more embodiments, the group comprises several clusters. In one or more embodiments, each cluster comprises a proper controlling module connected to the datacenter management system. The datacenter management system advantageously gives the repartition of the devices between the clusters in the datacenter.

The invention also relates to a datacenter comprising the group as previously described.

The invention also relates to a mounting process of at least one device in at least one cluster of the group as previously described, wherein, when the device is housed in any housing of the cluster, the electronic tag fixed on said device automatically comes in physical contact with both the data and power line and the ground line, so as to automatically connect the bus. This mounting process thus simultaneously allows to connect the electronic tag to the bus and thereafter, to the controlling module. No specific further manual action is required to connect the electronic tag and thus identifying the device. This eliminates any risk of omission or error.

The invention also relates to a dismounting process of at least one device in at least one cluster of the group as previously described, wherein, when said device is extracted from any housing of the cluster, the electronic tag fixed on said device automatically loses physical contact with both the data and power line and the ground line, so as to automatically disconnect the bus. The invention thus permits to identify the device as long as its electronic tag is connected to the bus, which corresponds to the device being housed in the cluster.

The invention also relates to a device identification process in a datacenter comprising the group as previously described, wherein, when the electronic tag of a device is connected to the bus of a cluster, the controlling module reads the identifier stored in the electronic tag, so as to identify the device housed in the cluster. The device identification thus only requires to read the electronic tag automatically connected to the bus, which is easy and quick.

In one or more embodiments, the management system provides, from the identifier read, an updated overview of the devices in the datacenter.

BRIEF DESCRIPTION OF THE DRAWINGS

The invention will be better understood by reading the description that follows, only given as an example, and by referring to the appended figures in which.

It should be noted that the figures set out the invention in a detailed manner to implement the invention, said figures obviously being able to serve to better define the invention if need be.

DETAILED DESCRIPTION OF THE INVENTION

Figure 1:
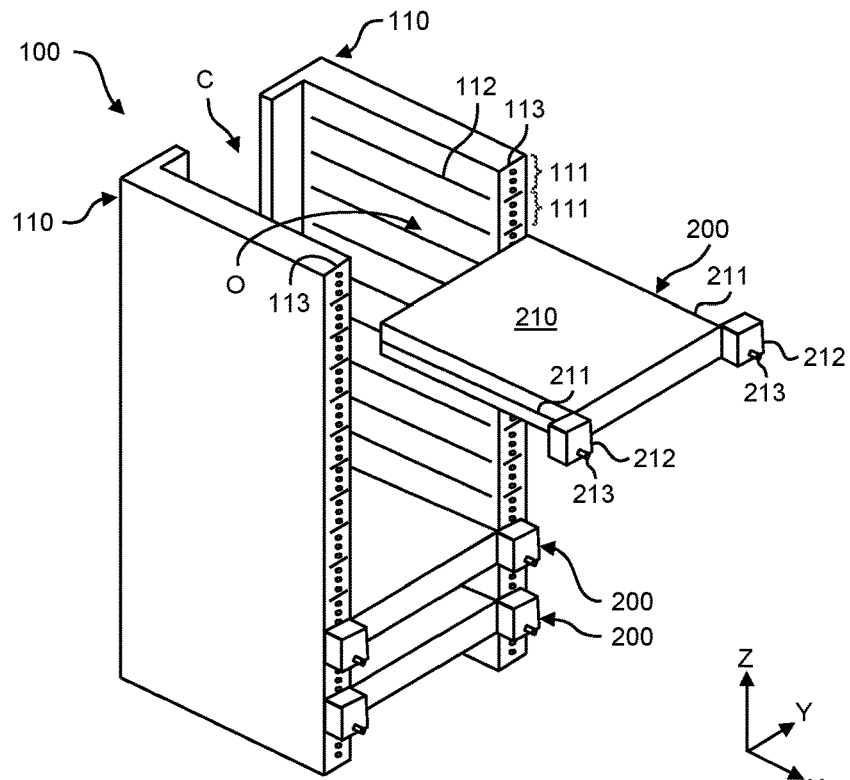
FIG. 1 is a perspective view of a cluster and a device in a datacenter according to prior art.
Figure 2:
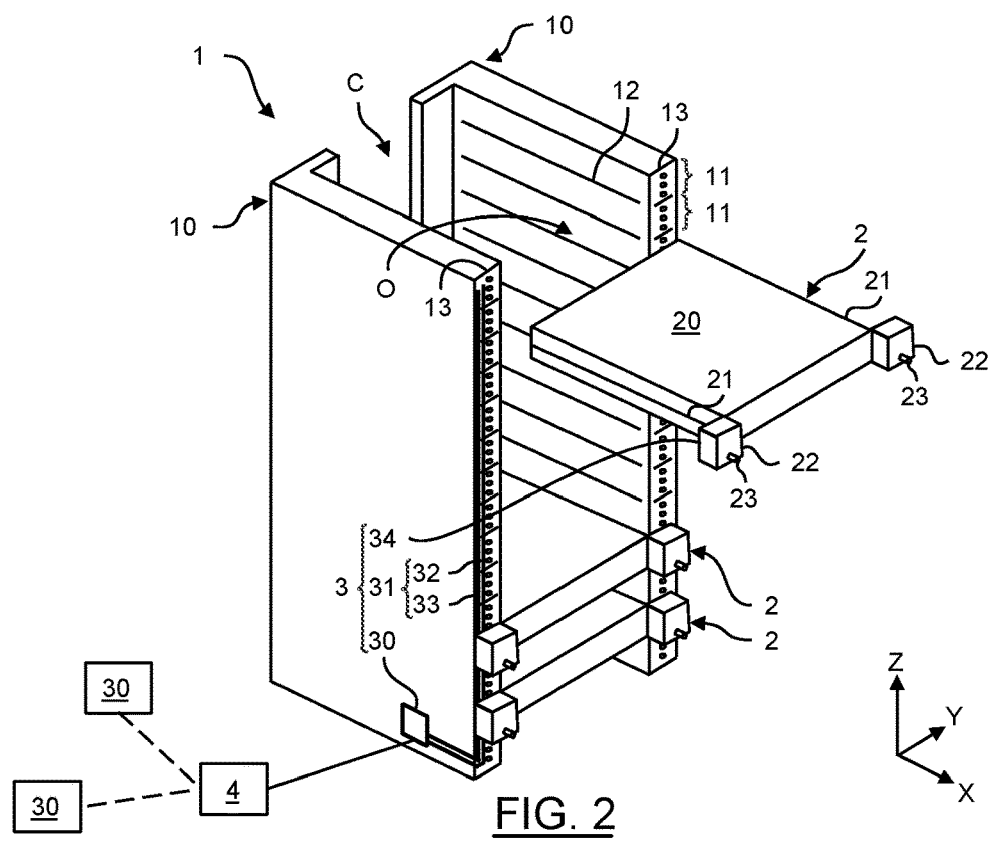
FIG. 2 is a perspective view of a cluster and a device in a datacenter comprising a device identification system according to the invention.

As illustrated in FIG. 2, one or more embodiments of the invention relate to a datacenter comprising several devices 2, such as servers, switches and routers, to organize, process and store data. The datacenter also comprises several racks, called "clusters 1", arranged in rows within the datacenter and configured to house said devices 2, to optimize footprint and for ease of wiring. For instance, the datacenter comprises more than one hundred clusters 1 each housing up to twenty devices 2. A single cluster 1 is represented on the example of FIG. 2 extending vertically along a vertical axis Z of an orthogonal system (X, Y, Z) and housing two devices 2, a third device 2 being about to be housed.

As represented on FIG. 2, a cluster 1 comprises two vertical side walls 10 delimiting a central cavity C with a front opening O, so as to define vertically stacked housings 11 along vertical axis Z. Each housing 11 is configured to house a device 2 and comprises guiding members 12, mounted horizontally onto the two vertical side walls 10, and an abutment portion 13 at the front end of the vertical side walls 10.

As represented on FIG. 2, each device 2 comprises a main body 20 and rails 21 laterally mounted onto the main body 20 to cooperate with the guiding members 12 of a housing 11 to horizontally slide the main body 20 into said housing 11. Each device 2 also comprises lateral grip members 22 configured to abut the abutment portion 13 when said device 2 is housed in said housing 11 along horizontal axis X. The lateral grip members 22 usually comprise fixation means 23 to the abutment portion 13 to ensure proper mechanical mounting of the device 2. Besides its mechanical mounting, each device 2 is connected to a power distribution unit, known as PDU, and to a network thanks to a management node (not represented) located within the cluster 1.

As illustrated in FIG. 2, the datacenter also comprises a datacenter management system 4 configured to control the devices 2 of the datacenter. Due to the large number of devices 2 and so as to ensure operability and maintenance in the datacenter, it is requested for the datacenter management system 4 to provide an updated overview of the devices 2 housed in each cluster 1.

To do so, as represented on FIG. 2 and according to the invention, each cluster 1 comprises at least one controlling module 30 and at least one bus 31, connected to the controlling module 30, which comprises one data and power line 32 and one ground line 33 both extending vertically continuously along the cluster 1. Still according to the invention, each device 2 comprises at least one electronic tag 34 fixed on it in a way to come in physical contact with both the data and power line 32 and the ground line 33, when the device 2 is housed in any housing 11 of the cluster 1, so as to automatically connect to the bus 31. The electronic tag 34 is configured to store an identifier of said device 2 to be read by the controlling module 30, when the electronic tag 34 is connected to the bus 31, so as to identify the device 2 housed in the cluster 1.

As illustrated in FIG. 2, the controlling module 30 and the bus 31 of one cluster 1 form, together with the electronic tag 34 of each device 2 housed in said cluster 1, a device identification system 3. The controlling modules 30 of the device identification systems 3 attached to each cluster 1 are connected to the datacenter management system 4 to provide, from the identifier of each device 2, an updated overview of the devices 2 in the datacenter.

Such a device identification system 3 avoids omissions or errors thanks to automatic connection while mounting and automatic data transmission as it will be better understood with the following description of different embodiments of the invention.

In the example shown in FIG. 2, according to a first embodiment, the cluster 1 comprises a single proper controlling module 30 and a single proper bus 31 to optimize the footprint of the device identification system 3. In the same way, each device 2 comprises a single electronic tag 34. In this embodiment, the bus 31 is fixed on the abutment portion 13 of one of the vertical side walls 10 so that the data and power line 32 and the ground line 33 extend vertically from the upper housing 11 to the lower housing 11 along vertical axis Z. The electronic tag 34 of a device 2 is fixed on one lateral grip member 22 of said device 2 in a way to come in physical contact with the bus 31, when the lateral grip member 22 abuts the abutment portion 13, that is, when the device 2 is housed in the cluster 1. The controlling module 30 is mounted in the cluster 1 at any location and connected to the bus 31.

Figure 3:
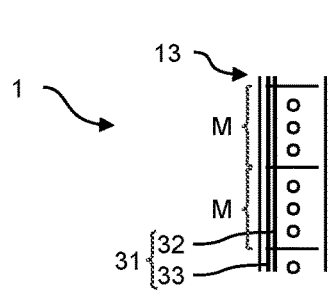
FIG. 3 is a front view of two housings of the cluster from FIG. 2.
Figure 3:
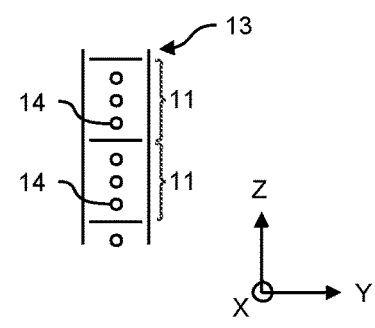

More precisely, as seen in FIGS. 2 and 3, the data and power line 32 and the ground line 33 of the bus 31 extend in parallel straight lines so as to form an elementary motif M identical for each housing 11. In other words, in each housing 11, the data and power line 32 and the ground line 33 extend at the same place, with the same shape and the same relative spacing. This advantageously enables the connection between an electronic tag 34 of a device 2 and the bus 31, regardless of the housing 11 in which said device 2 is housed, that is, universally for all the housings 11. Such a configuration in parallel straight lines is also easy to install, for example by gluing the lines 32, 33 on the abutment portion 13. Furthermore, in this example, the data and power line 32 and the ground line 33 are arranged laterally outside of fixation holes 14 configured to cooperate with the fixation means 23 of the device 2. This avoids to bother the fixation of the device 2 in the housing 11 while its mounting process. In addition, it is precised that the data and power line 32 and the ground line 33 both extend continuously from the upper housing 11 to the lower housing 11 so as to connect in series the electronic tag 34 of all the devices 2 housed in the cluster 1 to the controlling module 30.

In one or more embodiments, the data and power line 32 and the ground line 33 are both in the form of a bare wire, that is, free from electrical insulating sheath. This enables a connection with the electronic tag 34 of the devices 2 by simple physical contact. Thereafter, the bus 31 is free from any plug connector which needs a manual action as in the prior art.

Figure 4:
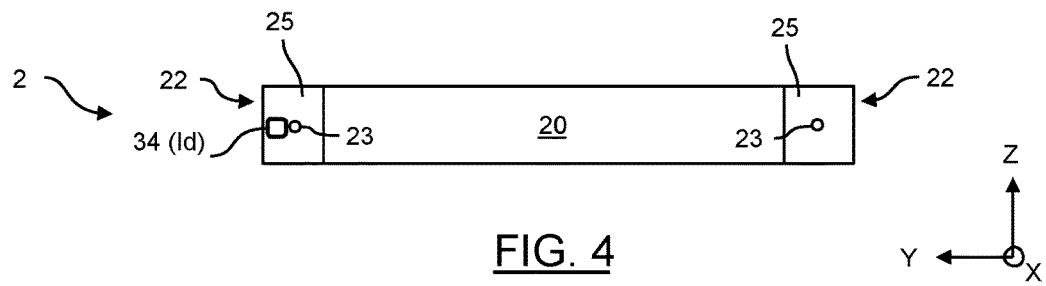
FIG. 4 is a rear view of the device from FIG. 2.

Referring now to FIG. 4 representing a device 2 from the back, the electronic tag 34 is fixed, for example by gluing, on the lateral grip member 22 configured to abut the side vertical wall 10, on which is fixed the bus 31. More precisely, the electronic tag 34 is fixed on the back face 25 of said lateral grip member 22, which extends vertically along vertical axis Z and is configured to be in contact with the abutment portion 13 of said side vertical wall 10. This allows a safe connection, guaranteed by the cooperation between the fixation means 23 of the device 2, such as screws, and the fixation holes 14 of the housing 11. In this example, the electronic tag 34 is positioned laterally outside the fixation means 23 as the bus 31 is positioned laterally outside the fixation holes 14, to permit their alignment during the mounting process (see FIG. 5).

Figure 5:
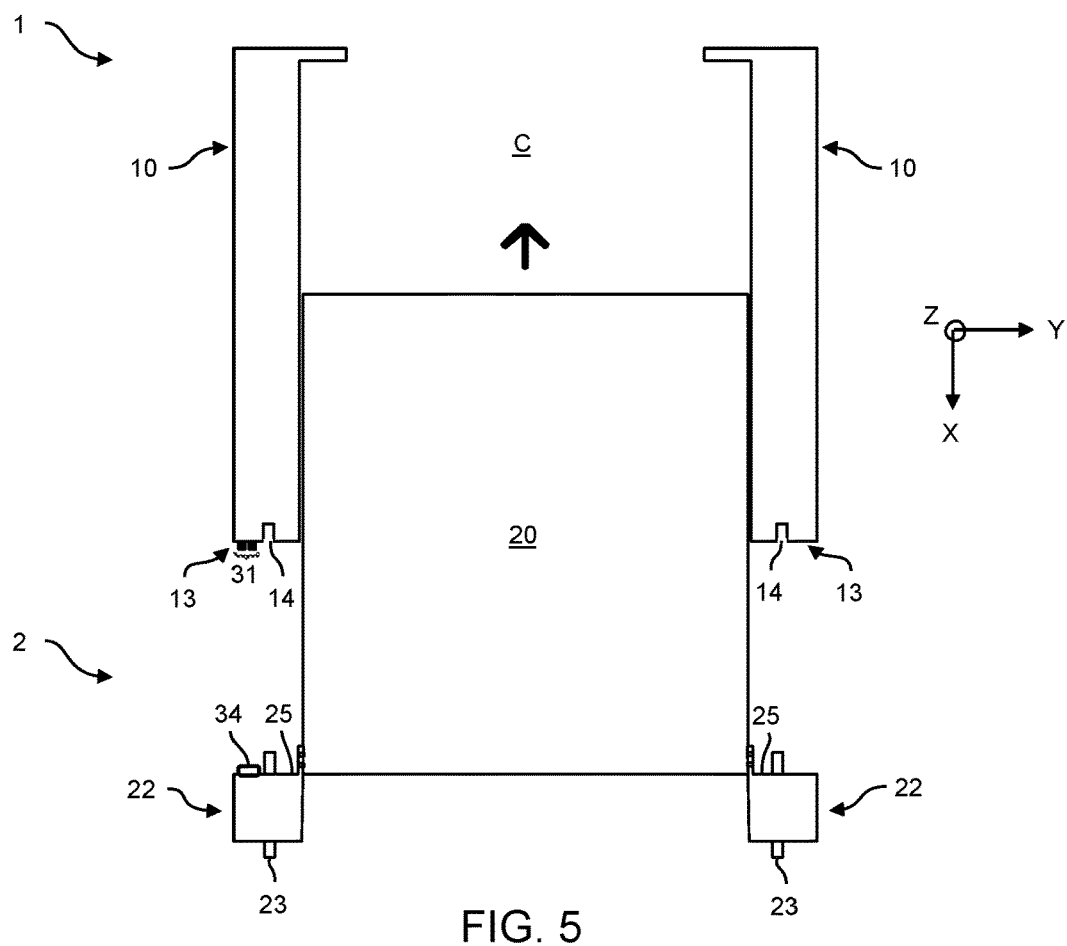
FIG. 5 is an upper view of the device mounting process in a housing of the cluster from FIG. 2.

Referring to FIG. 5, the electronic tag 34 fixed on a device 2 and the bus 31 fixed on the cluster 1 are thus positioned so as to automatically come in mutual contact while the mounting process of the device 2 in a housing 11. Indeed, when the main body 20 of the device 2 is inserted in the cavity C, the lateral grip members 22 are aligned with the abutment portion 13 of the side vertical walls 10, as well as the electronic tag 34 with the bus 31. The device 2 is then pushed in the housing 11 until the lateral grip members 22 abut the abutment portions 13. This action has the effect of bringing the electronic tag 34 nearer to the bus 31 by horizontal translation along axis X until they are in contact. The fixation means 23 then cooperate with the fixation holes 14 to both maintain the device 2 in the housing 11 and the electronic tag 34 against the bus 31. The connection of the electronic tag 34 thus requires no specific manual action as it results from the device 2 mounting process.

More precisely, the electronic tag 34 comprises two connection areas to the bus 31, that is, a data and power connection area and a ground connection area configured respectively to come in contact with the data and power line 32 and the ground line 33.

As illustrated in FIG. 4, for example, the electronic tag 34 is in the form of a 1-Wire® sensor with an embedded memory to store an identifier Id of the device 2 on which the electronic tag 34 is fixed. Such an electronic tag 34 is advantageously very compact as it is free from proper powering source. In one or more embodiments, the electronic tag 34 comprises a flat form with a thickness of less than 1 mm, for example, less than 0.8 mm. The device identification system 3 is thus in the form of a One-Wire® communication system wherein the controlling module 30 is configured to both power and communicate with the electronic tag 34 through the data and power line 32, in order to read the identifier Id. In other words, the data and power line 32 ensures both data and energy transmission between the controlling module 30, i.e. the master, and the electronic tag 34, i.e. the slave. In one or more embodiments, the electronic tag 4 is chosen between the commercial references DS2431G and DS2431GA.

Figure 6A:
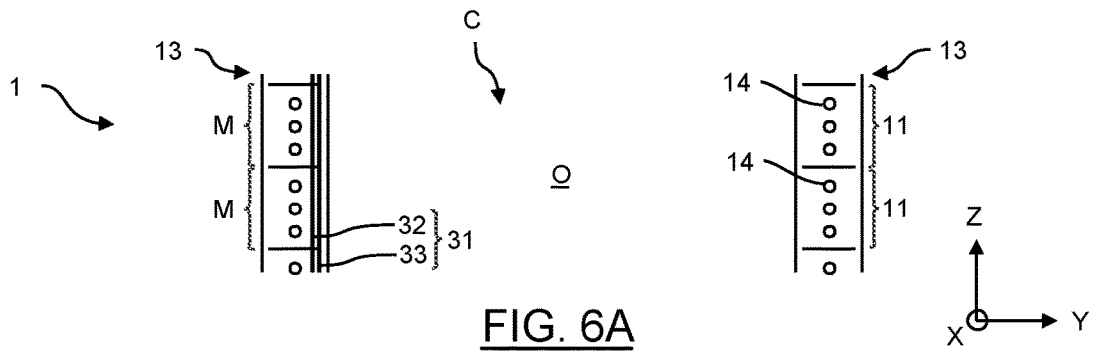
FIG. 6A.

It goes without saying that the invention is not restricted to the first embodiment previously described. In the example shown on FIG. 6A, the bus 31 extends at a different location, that is, laterally inside the fixation holes 14. In practice, the location of the bus 31 on the abutment portion 13 is adapted to fit with the available place.

Figure 6B:
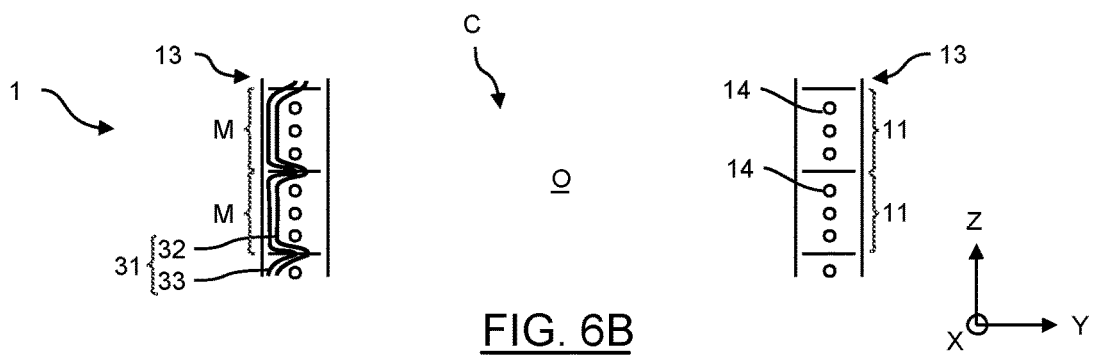
FIG. 6B.

Moreover, in the example shown on FIG. 6B, the bus 31 describes a different elementary motif M, not in straight lines as previously presented. Indeed, the data and power line 32 and the ground line 33 extend, between each housing 11, aligned with the fixation means 14, and ich each housing 11, circumvent said fixation means 14. In other words, the elementary motif M is in the form of a U, pointing the cavity C. It goes without saying that the elementary motif M could be different, for instance in the form of a U pointing outside, as long as it is repeated in each housing 11.

Figure 6C:
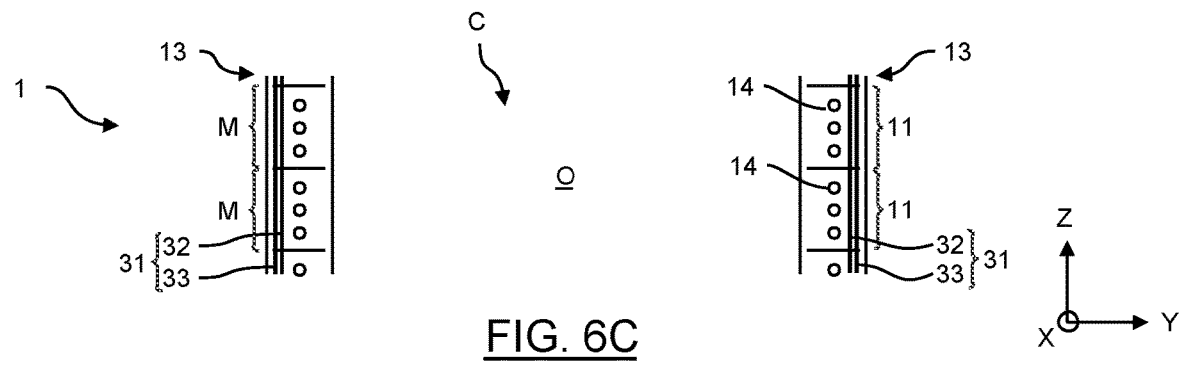
FIG. 6C are front views of two housings of the cluster with a bus according to three variants of the invention.

Referring now to the example of FIG. 6C, the cluster 1 comprises two busses 31, one bus 31 being fixed on each side vertical wall 10. Advantageously, this enables to connect the electronic tag 34 of a device 2 whether it is fixed on a lateral grip member 22 or the other. The device 2 could also comprise two electronic tags 34, one on each lateral grip member for data redundancy.

Figure 7A:
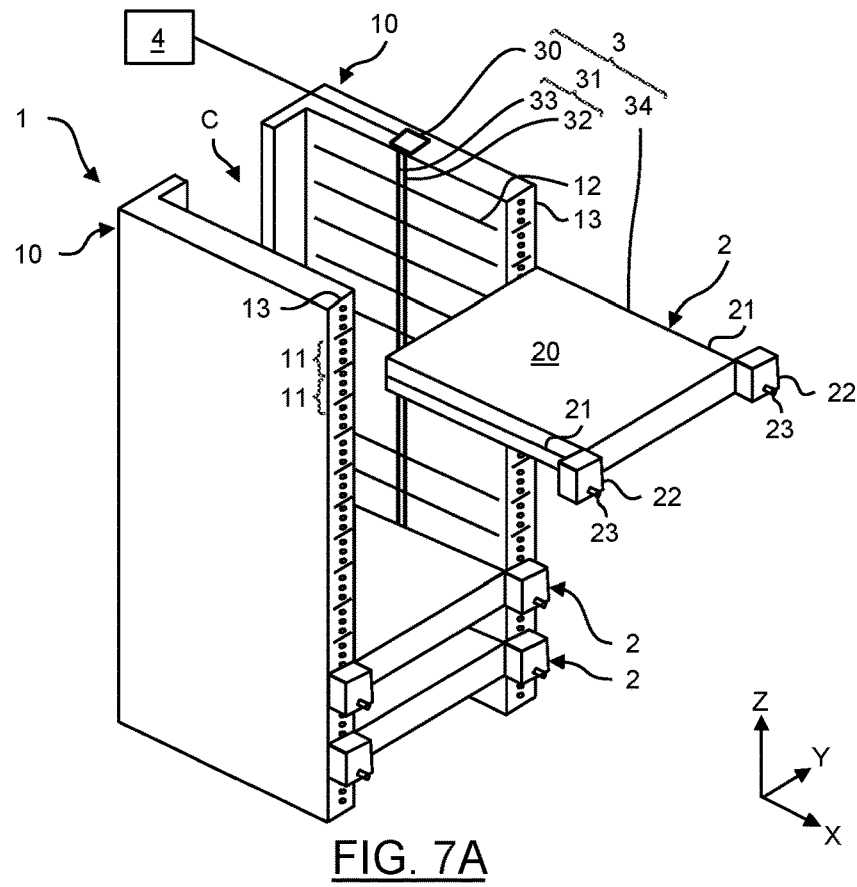
FIG. 7A is a perspective view of a cluster and a device in a datacenter with a bus according to another embodiment of the invention.
Figure 7B:
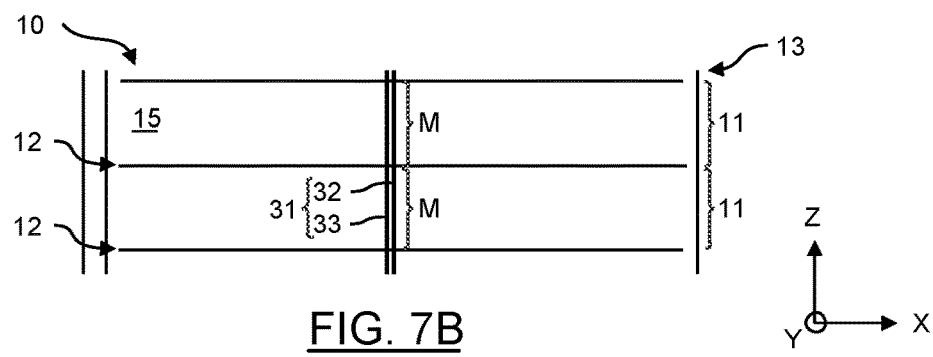
FIG. 7B is a lateral view of two housings of the cluster from FIG. 7A.
Figure 7C:
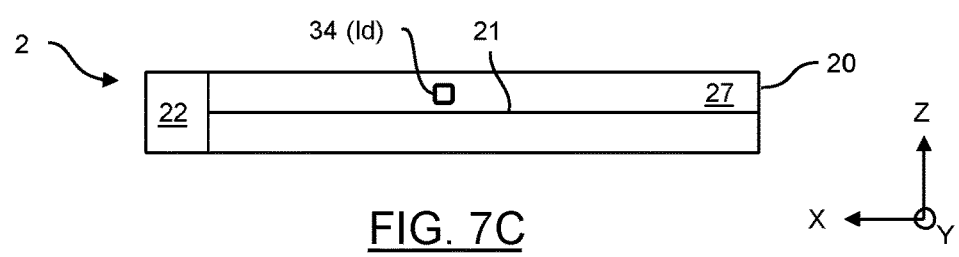
FIG. 7C is a lateral view of the device from FIG. 7A.

Referring now to FIGS. 7A, 7B and 7C, according to another embodiment of the invention, the bus 31 is fixed on the interior face 15 of one side vertical wall 10 delimiting the cavity C. As previously, the data and power line 32 and the ground line 33 extend vertically from the upper housing 11 to the lower housing 11, in this case, by crossing the guiding members 12. The electronic tag 34 is fixed on a lateral face 27 of the main body 20, where is also located a rail 21. In this example, the electronic tag 34 is positioned above the rail 21, but it goes without saying that the electronic tag 34 could also be positioned below or even on the rail 21. Furthermore, in this example, the bus 31 and the electronic tag 34 are respectively positioned in the middle of the interior face 15 and the lateral face 27, so as to be aligned in contact when the device 2 is housed in a housing 11. It goes without saying that the bus 31 and the electronic tag 34 could be positioned differently as long as they are aligned to come in contact during the mounting process of the device 2.

Figure 7D:
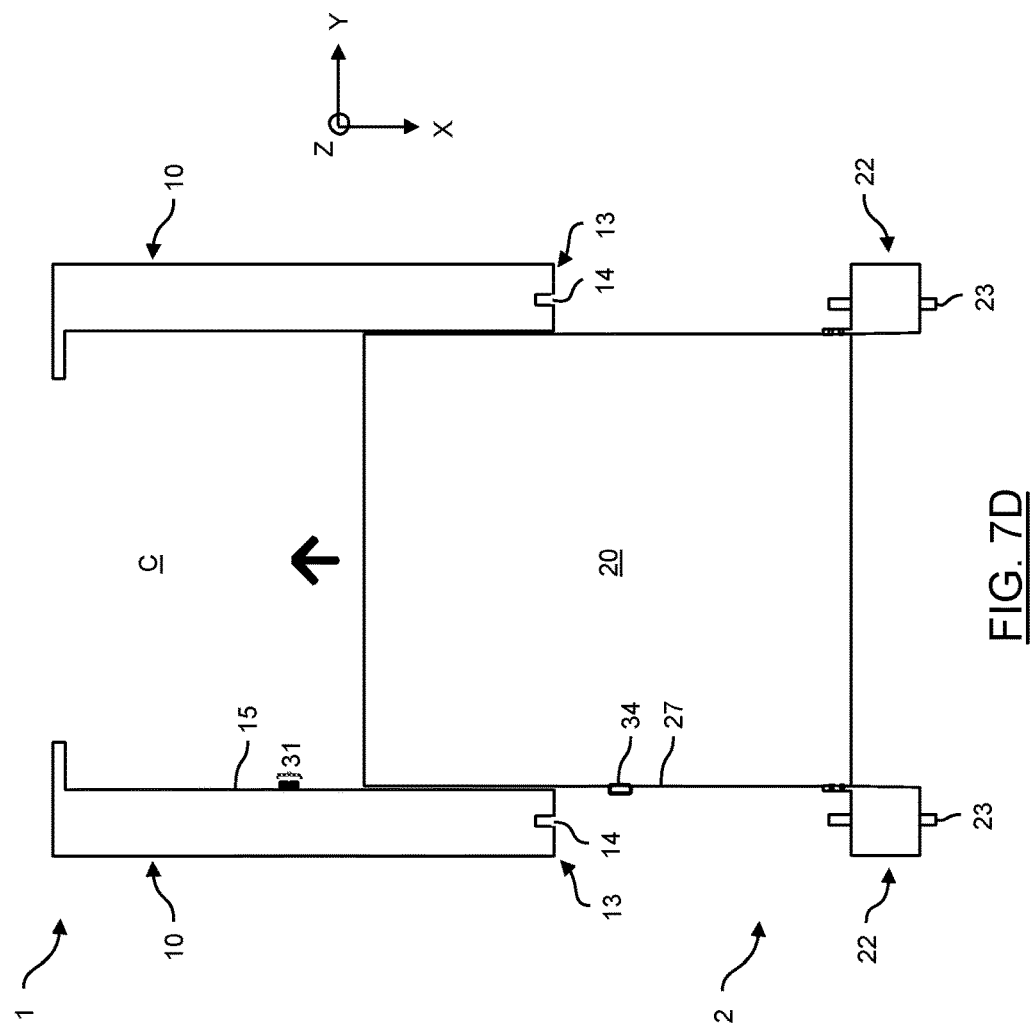
FIG. 7D is an upper view of the device mounting process in a housing of the cluster from FIG. 7A.

As represented on FIG. 7D, the mounting process of a device 2 in a housing 11 of the cluster 1 according to this embodiment differs from the first embodiment in that the electronic tag 34 comes in contact with the bus 31 by sliding in the housing 11 instead of abutting the abutment portion 13. Indeed, in the first embodiment, the electronic tag 34 and the bus 31 are aligned in front of each other along horizontal axis X and come in contact by an abutment along horizontal axis X. In this embodiment, the bus 31 is pointing the cavity C along horizontal axis Y while the electronic tag 34 is pointing in the opposite direction. The sliding along horizontal axis X of the main body 20 of the device 2 then enables to align them along said horizontal axis Y in contact. As previously, the device 2 mounting enables at the same time to connect the electronic tag 34 and the bus 31. The fixation means 23 then cooperate with the fixation holes 14 to both maintain the device 2 in the housing 11 and the electronic tag 34 in alignment with the bus 31.

Figure 8:
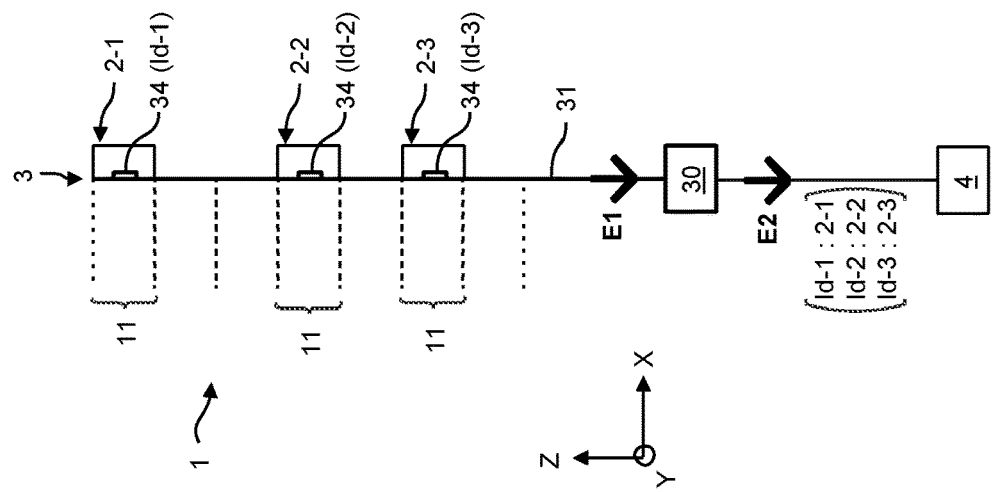
FIG. 8 is a schematic illustration of the device identification process according to the invention.

After having presented several embodiments of the invention, the device identification process thanks to the device identification system 3 is thereafter described. As illustrated in FIG. 8 and according to the invention, the device identification process is implemented by the controlling module 30 who reads E1 the identifier Id stored in the electronic tags 34 connected to the bus 31 so as to identify the devices 2 housed in the cluster 1. Each controlling module 30 then sends E2 the list of the identifiers Id of the housed devices 2 to the datacenter management system 4 to have an overview of the devices 2 in the datacenter. In one or more embodiments, the device identification process is repeated, for instance periodically, to update the overview. In other words, the controlling module 30 sends E2 an updating list of the identifiers Id adding the new housed devices 2 and deleting the dismounted devices 2.

In the example of FIG. 8, three electronic tags 34 (Id-1), 34 (Id-2), 34 (Id-3) are connected by contact to the bus 31. The controlling module 30 thus reads E1 the identifier Id-1, Id-2, Id-3 stored in these electronic tags 34 (Id-1), 34 (Id-2), 34 (Id-3) through the data and power line 32. The controlling module 30 then determines the devices 2-1, 2-2, 2-3 corresponding to the identifiers Id-1, Id-2, Id-3, so as to determine the devices 2 housed in the cluster 1. Such a process is advantageously automatically, easily and quickly implemented and avoids any error or omission. All the devices 2-1, 2-2, 2-3 belonging to the cluster 1 are reported in the overview.

Figure 9B:
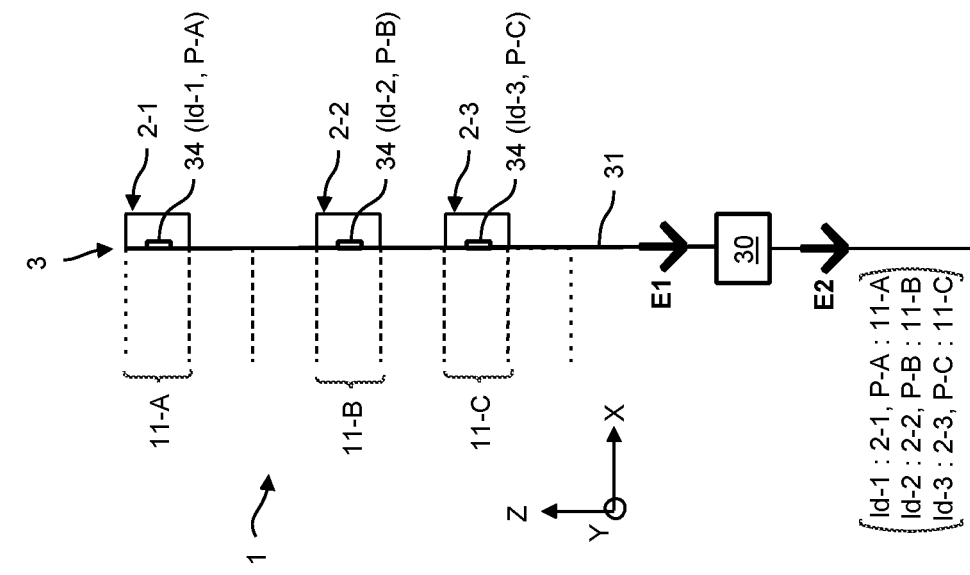
FIG. 9B are schematic illustrations of the device identification process according to two embodiments of the invention.
Figure 9A:
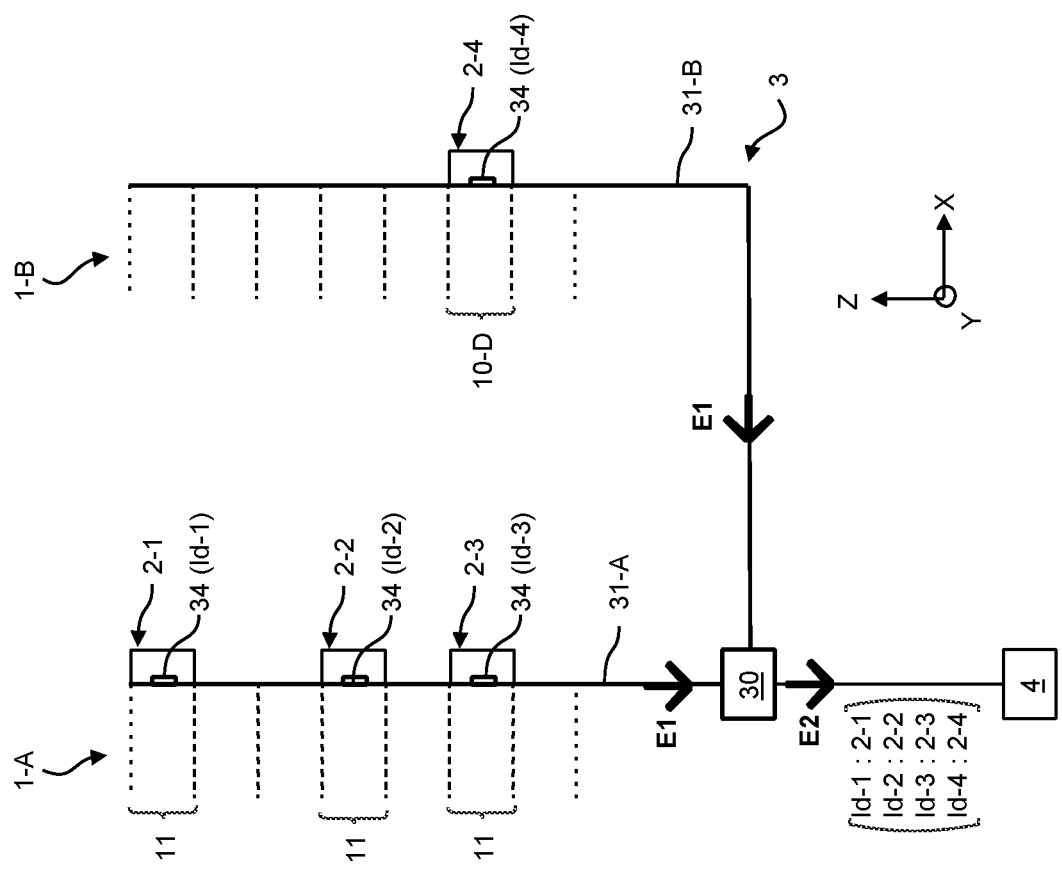
FIG. 9A.

Referring to FIG. 9A, according to another embodiment of the invention, the device identification system 3 is not proper to a cluster 1. In this example, the device identification system 3 comprises two busses 31-A, 31-B mounted in two different clusters 1-A, 1-B and connected to the same controlling module 30. During the device identification process, the controlling module 30 thus reads, on the one hand, the identifiers Id-1, Id-2, Id-3 through the first bus 31-A to identify the devices 2-1, 2-2, 2-3 housed in the first cluster 1-A, and on the other hand, the identifier Id-4 through the second bus 31-B to identify the device 2-4 housed in the second cluster 1-B.

Referring to FIG. 9B, according to another embodiment of the invention, the electronic tag 34 of a device 2 is configured to store the position P of the device 2 in the cluster in addition to its identifier Id. The position P of the device 2 corresponds to the housing 11 in which the device 2 is housed. During the device identification process, the controlling module 30 thus reads both the identifier Id-1, Id-2, Id-3 and the position P-A, P-B, P-C stored in each connected electronic tag 34 (Id-1, P-A), 34 (Id-2, P-B), 34 (Id-3, P-C), in order to both identify the devices 2 housed and their position in the cluster 1. In this example, the positions P-A, P-B and P-C correspond to the housings 11-A, 11-B, 11-C. This advantageously enables the datacenter management system 4 to have an overview composed of the identifiers Id and the position P of the devices 2 in the cluster 1. During a maintenance, the position P of a device 2 is thus immediately determined.

To summarize, the device identification system 3 according to the invention comprises, on one hand, one or several bus(ses) 31 and a controlling module 30 fixed in the cluster 1, and on the other hand, electronic tags 34 fixed on devices 2 so as to automatically connect the controlling module 30 by electrical contact with the bus 31. This automatic connection is advantageously obtained simultaneously with the mounting by positioning the electronic tags 34 in contact to the bus 31, this latter being in the form of bare wires. The device identification process according to the invention is also automatic and enables to identify the devices 2 housed through an identifier Id stored in the electronic tag 34, which is read by the controlling module 30 via the bus 31.

What is claimed is:

1. A group of at least one cluster and at least one device, comprising: at least one cluster and at least one device in a datacenter, wherein
    each cluster of said at least one cluster comprises a plurality of vertically stacked housings, each housing of said plurality of vertically stacked housings being configured to house one device of said at least one device, each cluster comprising at least one controlling module and at least one bus connected to the at least one controlling module, each bus of the at least one bus comprising one data and power line and one ground line both extending vertically continuously along each cluster, the one data and power line and the one ground line extending in an elementary motif identically repeated for each housing;
    each device of the at least one device comprises at least one electronic tag configured to store an identifier of each device and forming together with the at least one controlling module and the at least one bus a device identification system, the at least one electronic tag being fixed on an external surface of each device in a way to come in physical contact with both the one data and power line and the one ground line, when each device is housed in any housing of the at least one cluster, to automatically connect the at least one bus in said each housing of said each cluster; and
    the at least one controlling module is configured to read the identifier, when the at least one electronic tag is connected to the at least one bus, so as to identify each device housed in each cluster;
    wherein said each bus is only constituted of two lines with said one data and power line a single data and power line and said one ground line as a single ground line, such that each electronic tag of said at least one electronic tag comprises two connection areas to said each bus, wherein said two connection areas comprise a data and power connection area connected to said single data and power line and a ground connection area connected to said single ground line;
    wherein, when the at least one device is housed in any housing of the at least one cluster, the at least one electronic tag fixed on said at least one device is configured to automatically come in physical contact with both the one data and power line and the one ground line, to automatically connect the at least one bus;
    wherein, when the at least one electronic tag of each device is connected to the at least one bus of a cluster, the at least one controlling module is configured to read the identifier stored in the at least one electronic tag, to identify said each device housed in the at least one cluster.

2. The group according to claim 1, wherein said at least one bus comprises a single bus such that said each cluster comprises said single bus.

3. The group according to claim 1, wherein the one data and power line comprises a bare wire to connect the at least one electronic tag by physical contact.

4. The group according to claim 1, wherein
    said each cluster further comprises two vertical side walls delimiting a central cavity with a front opening so as to define the plurality of vertically stacked housings, each housing of the plurality of vertically stacked housings comprising guiding members mounted onto the two vertical side walls and an abutment portion at a front end of the two vertical side walls, the at least one bus being mounted onto the abutment portion of said each housing; and said each device further comprises a main body and rails laterally mounted onto the main body to cooperate with the guiding members of a housing of said plurality of vertically stacked housings to slide the main body into said housing, each device further comprising lateral grip members configured to abut the abutment portion when said each device is housed in said each housing, the at least one electronic tag being fixed on at least one of the lateral grip members.

5. The group according to claim 4, wherein the at least one electronic tag is fixed on a back face of a lateral grip member of said lateral grip members.

6. The group according to claim 1, wherein said each cluster further comprises two vertical side walls delimiting a central cavity with a front opening so as to define the plurality of vertically stacked housings, each housing of the plurality of vertically stacked housings comprising guiding members mounted onto the two vertical side walls, the at least one bus being mounted onto at least one of the two vertical side walls crossing the guiding members of said each housing; and said each device further comprises a main body and rails laterally mounted onto the main body to cooperate with the guiding members of a housing of said plurality of vertically stacked housings to slide the main body into said housing, the at least one electronic tag being laterally fixed on the main body.

7. The group according to claim 1, further comprising a datacenter management system connected to the at least one controlling module and configured to provide, from the identifier of said each device housed in the at least one cluster, an updated overview of the at least one device in the datacenter.

8. The group according to claim 1, wherein said each device further comprises lateral grip members configured to abut an abutment portion of said each housing when said each device is housed in said each housing;

said lateral grip members comprise
- a first lateral grip member on a left side of said each device,
- a second lateral grip member on a right side of said each device, wherein said right said is an opposing said from said left side of said each device,
- fixation means configured to connect to the abutment portion to ensure mechanical mounting of said each device with said abutment portion.

* * * * *